United States Patent
Hsiao

[11] Patent Number: 6,165,001
[45] Date of Patent: Dec. 26, 2000

[54] ELECTRICAL CONNECTOR

[75] Inventor: Shih-Wei Hsiao, Kaohsiung, Taiwan

[73] Assignee: Hon Hai Precision Ind. Co., Ltd., Taipei Hsien, Taiwan

[21] Appl. No.: 09/330,869

[22] Filed: Jun. 11, 1999

[30] Foreign Application Priority Data

Dec. 28, 1998 [TW] Taiwan ................................ 87221627

[51] Int. Cl.[7] ............................ H01R 13/625; H01R 4/50
[52] U.S. Cl. ............................................ 439/342; 439/856
[58] Field of Search .................................. 439/342, 259, 439/83, 856

[56] References Cited

U.S. PATENT DOCUMENTS 5,370,549 12/1994 Lee ........................................... 439/342
5,989,049 12/1998 Walkup et al. ......................... 439/342

*Primary Examiner*—Neil Abrams
*Assistant Examiner*—Javaid Nasri
*Attorney, Agent, or Firm*—Wei Te Chung

[57] ABSTRACT

An electrical connector connects a CPU to a circuit board. Conductive contacts received in passageways defined in a base of the connector include a base section, a fixed section extending longitudinally from one end of the base section, and a connection section extending from an opposite end of the base section. A contact section is formed at an end of the connection section. The fixed section extends through the corresponding passageway and beyond the base to contact the main circuit board. Thus, terminals of the CPU can be received between the base section and the contact section of the corresponding contacts of the present invention. Furthermore, the structure of the contacts reduces the electrical conduction length thereof.

7 Claims, 6 Drawing Sheets

ELECTRICAL CONNECTOR

BACKGROUND OF THE INVENTION

The present invention relates to an electrical connector, and particularly to a PGA (Pin Grid Array) socket for connecting an integrated circuit package to a circuit board. An electrical connector, such as the disclosure of Taiwan Patent Application No.82602428, lowers the insertion force when conductive contacts of an integrated circuit package are inserted into the connector. Referring to FIG. 1, the conventional electrical connector includes a cover 2 and a base 3, and a conductive contact 31 is received in a hole 32 of the base 3. When an outer terminal 11 of an integrated circuit package 1 is inserted into a leading hole 21 of a cover 2, then the terminal 11 will be leaded to the hole 32 of the base 3 to electrically contact with a conductive contact 31. The disclosed electrical connector uses the elasticity of the conductive contacts 3 to connect with terminals 11 of the IC package. Although the conventional contacts have a short conduction length, the contact elasticity thereof is limited by a receiving space of the electrical connector, thus reliable contact cannot be provided. Although the conventional contacts provide a reliable engagement, each contact has a long conduction length thereby leading to low conductive efficiency. Hence, there is a need for an electrical connector which provides reliable electrical contact and has a short conduction length.

BRIEF SUMMARY OF THE INVENTION

Accordingly, one object of the present invention is to provide an electrical connector having reliable elastic connection with a CPU.

Another object of the present invention is to provide an electrical connector having contacts of short conduction length thereby reducing an overall height of an insulative housing thereof.

To fulfill the above mentioned objects, an electrical connector in accordance with the present invention comprises an insulative housing and a plurality of conductive contacts received therein. A bottom face of the housing is mounted to a circuit board and a top face of the housing supports a CPU thereon. Each contact has a base section, a fixed section extending from one end of the base section, and a connection section extending from an opposite end of base section. A contact section opposite the base section extends from the connection section.

Other objects, features, and advantages of the present invention will become apparent after reading the following detailed description of the preferred embodiment of the invention taken in conjunction with the appended drawing figures.

DETAILED DESCRIPTION OF THE INVENTION

Figure 1:
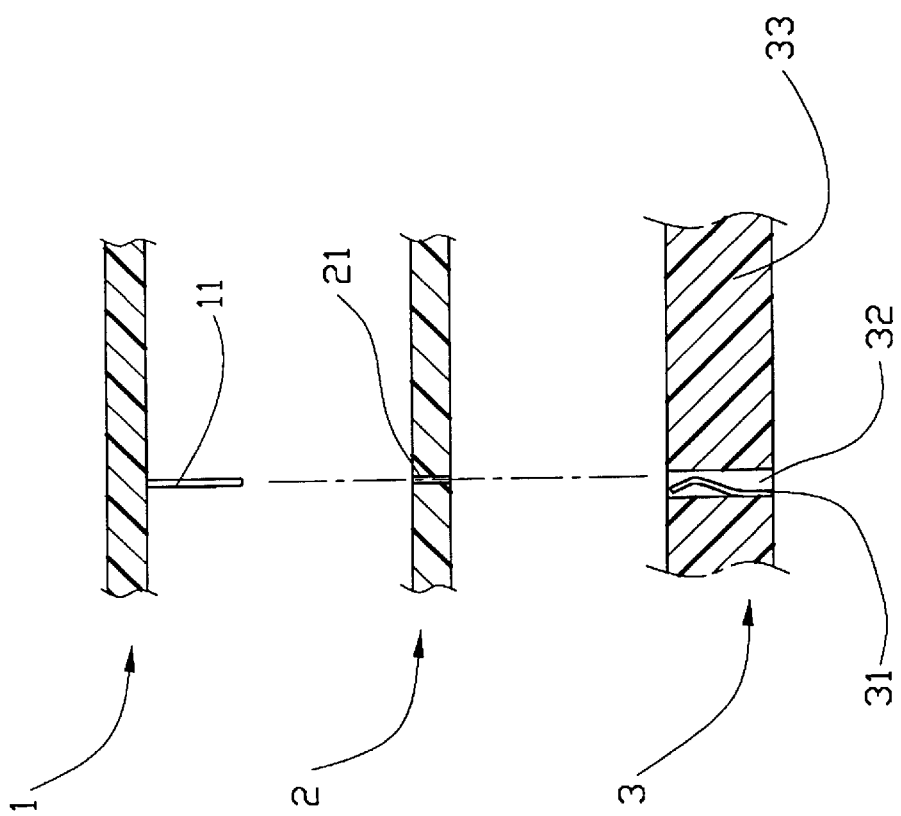
FIG. 1 is a cross-sectional view of a conventional electrical connector.
Figure 2:
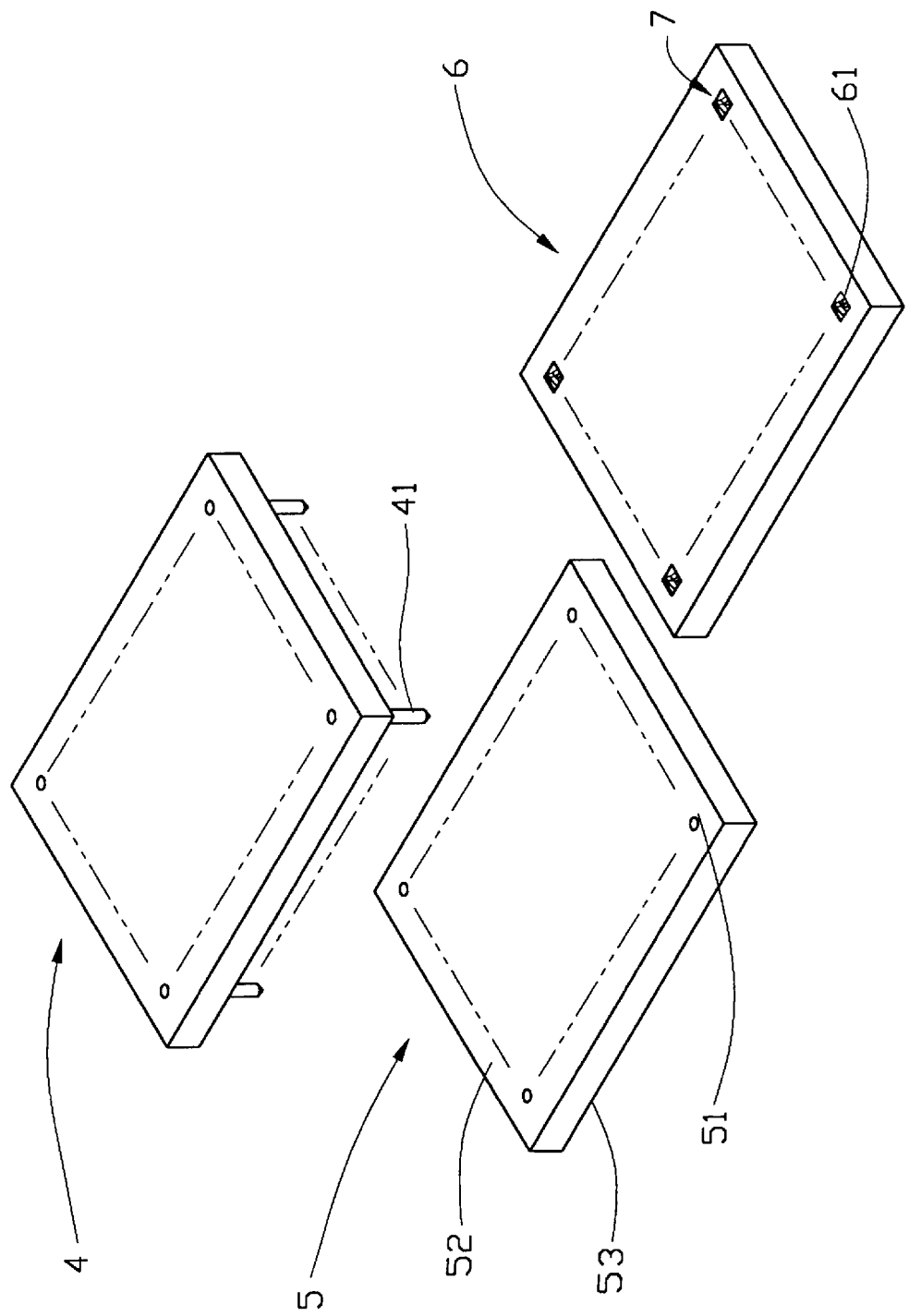
FIG. 2 is an exploded view of an electrical connector in accordance with the present invention.
Figure 3:
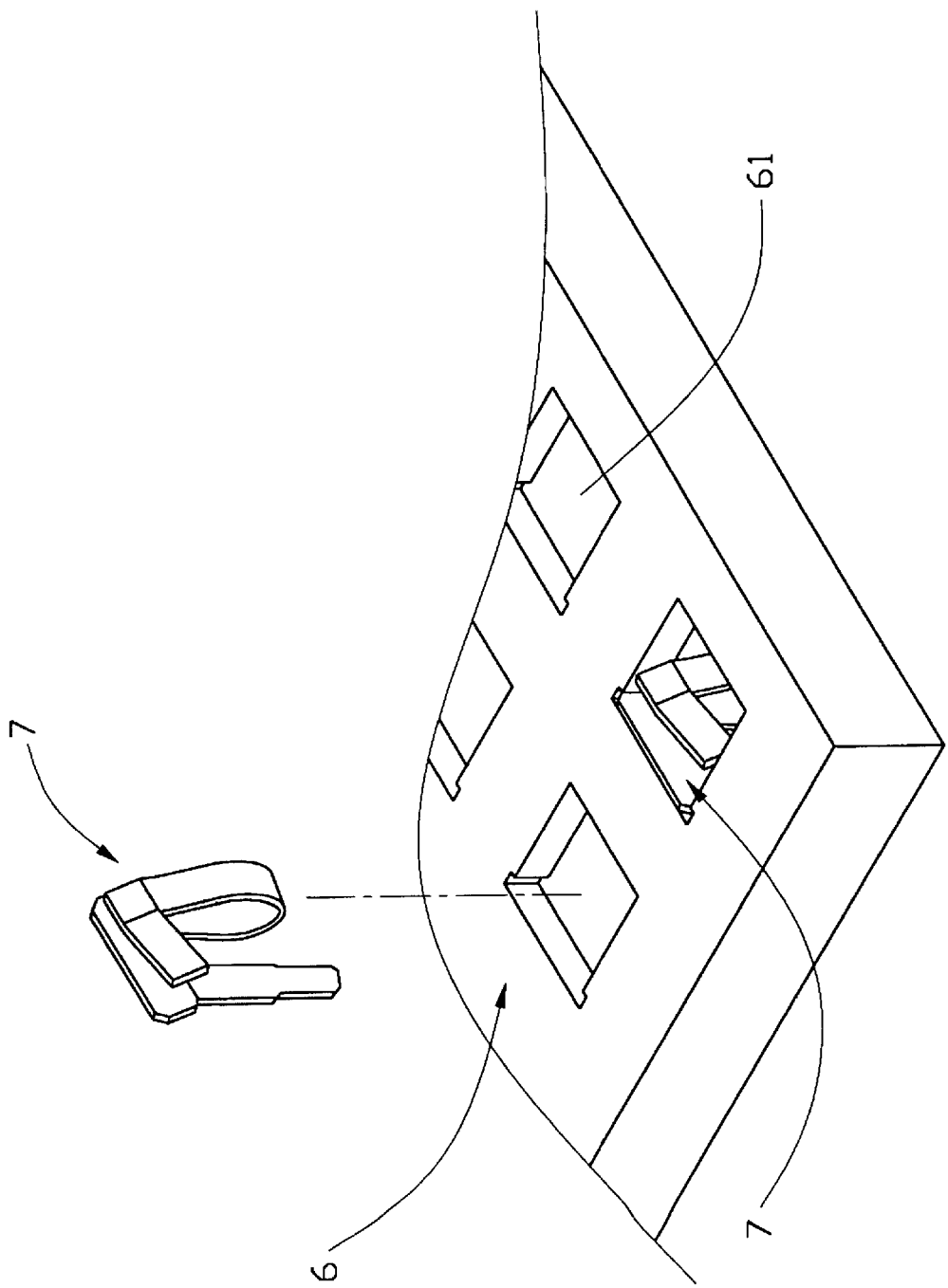
FIG. 3 is an enlarged, partial view of a base of the electrical connector of the present invention.
Figure 4:
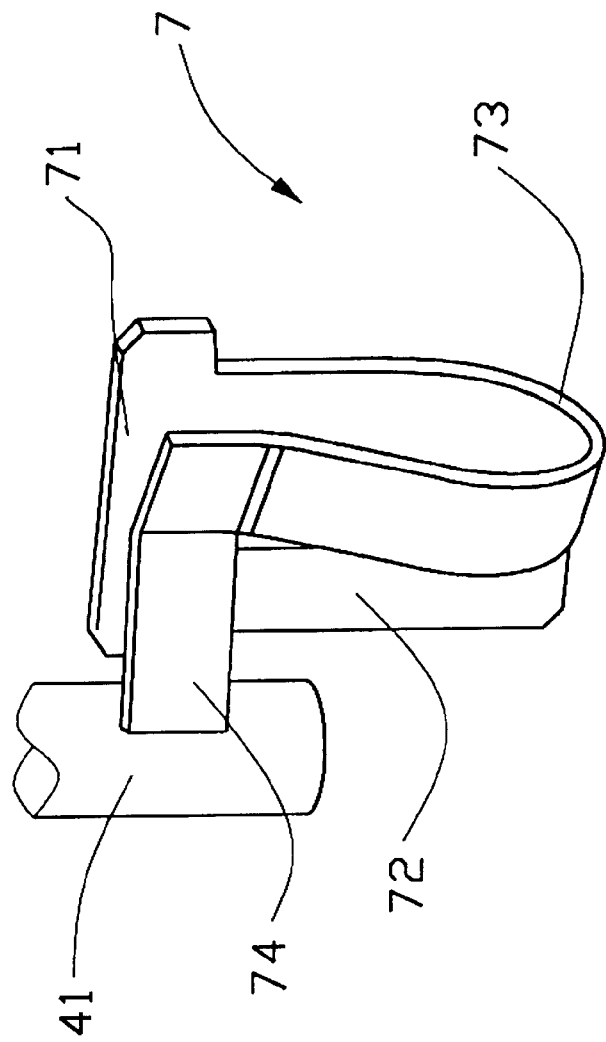
FIG. 4 is a perspective view of a conductive contact of the present invention and a contact of a CPU.

Referring to FIGS. 2 to 4, an electrical connector in accordance with the present invention mainly comprises a cover 5, a base 6 and a plurality of conductive contacts 7. A plurality of leading holes 51 is defined between a top surface 52 and a bottom surface 53 of the cover 5 for receiving terminals 41 of CPU 4. The base 6 defines a plurality of passageways 61 corresponding to the holes 51 of the cover 5 and each receives a conductive contact 7 therein. A portion of each conductive contact 7 extends into the corresponding leading hole 51 of the cover 5 for contacting the corresponding terminals 41 of the CPU 4. A tail of the conductive contact 7 contacts a main circuit board (not shown). When the cover 5 is positioned on the base 6, the leading holes 51 of the cover 5 align with the passageways 61 of the base 6. The CPU 4 is then positioned on the cover 5 whereby the terminals 41 of the CPU 4 extending into the leading holes 51 of the cover 5 are snugly received in a space defined between a contact section 74 and a base section 71 of the corresponding conductive contact 7 received in the base 6 whereby negligible resistance acts on the terminals 41.

Figure 5:
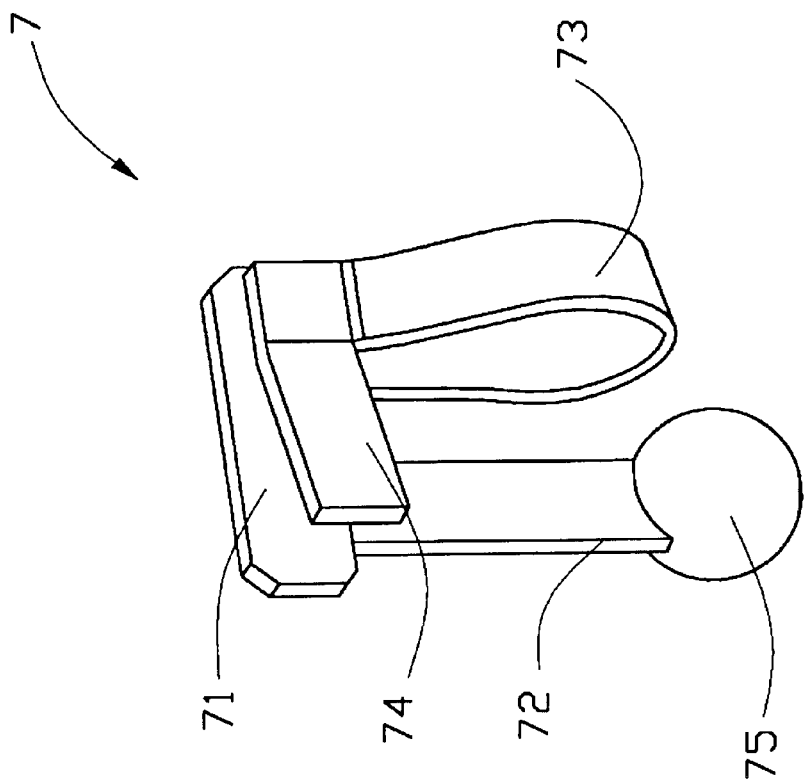
FIG. 5 is a perspective view of the conductive contact of the present invention with a solder ball fixed to a free end thereof.
Figure 6:
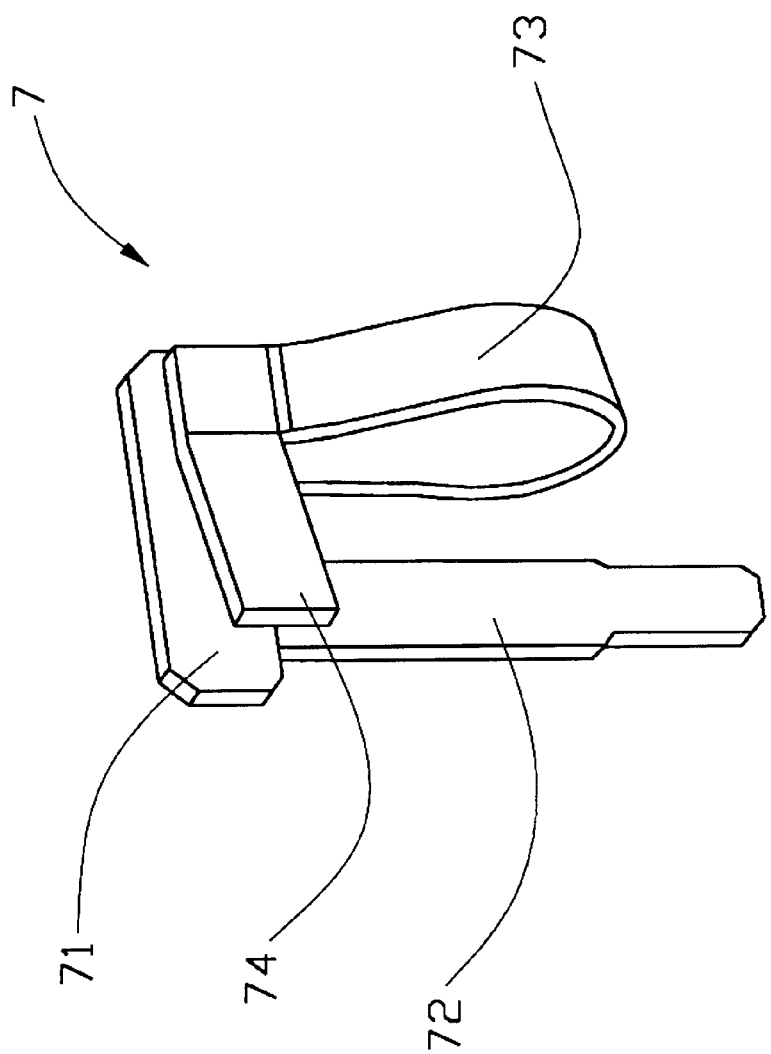
FIG. 6 is a perspective view of the conductive contact of the present invention having an end for through-hole connection.

Referring to FIGS. 5 and 6, each conductive contact 7 includes the base section 71, a fixed section 72 extending from one end of the base section 71, a connection section 73 extending from an opposite side of the base section 71, and the contact section 74 extending from the connection section 73. The fixed section 72 extends through the passageway 61 of the base 6 to contact the circuit board. The base section 71 and the contact section 74 clamp the corresponding terminal 41 of the CPU 4. The above-mentioned structure reduces the height of the electrical connector and decreases the instance of electrical signal loss.

The fixed section 72 contacts the circuit board in two ways. Referring to FIG. 5, a solder ball 75 is positioned at the end of fixed section 72. Referring to FIG. 6, the fixed section 72 is assembled to the circuit board by surface mounting. Both methods reduce the height of the electrical connector and improve the efficiency of electrical conduction while conserving the occupied space on the main circuit board.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

I claim:

1. An electrical connector for connecting a CPU to a circuit board, comprising:

a cover having a top surface for supporting the CPU thereon and a bottom surface opposite the top surface, a plurality of leading holes being defined between the top and bottom surfaces;

a base including an upper surface for supporting the cover thereon and a lower surface for mounting to the circuit board, a plurality of passageways being defined between the upper and lower surfaces; and a plurality of conductive contacts received in the passageways of the base, each contact including a base section defining two opposite ends, a fixed section vertically downwardly extending from one end of said base section and a connection section defining two opposite ends, one end of the connection section vertically downwardly extending from the other end of said base section, a bent contact section extending from the other end of said connection section and located opposite to said base section thereby forming a clamping space between the bent contact section and the base section for clamping a terminal of the CPU.

2. The electrical connector as claimed in claim 1, wherein said fixed section is an elongate plate extending from the base section, the fixed section forming a terminal at a free end thereof for through-hole connection.

3. The electrical connector as claimed in claim 1, wherein said fixed section is an elongate plate extending from the base section, the fixed section forming a wide plate for surface mounting.

4. The electrical connector as claimed in claim 1, wherein the contact section is an elongate plate extending from the connection section and facing the base section at a predetermined angle to form the clamping space between the base section and the contact section.

5. The electrical connector as claimed in claim 1, wherein the cover is an elongate plate.

6. The electrical connector as claimed in claim 5, wherein the base is an elongate plate mating with the cover, the passageways of the base aligning with the leading holes of the cover, respectively.

7. A contact for use with a CPU comprising:
a horizontal base section defining two opposite ends;
a fixed section vertically downwardly extending from one end of said base section;
a U-shaped connection section defining two opposite ends, one end of which vertically downwardly extends from the other end of said base section; and
a contact section horizontally extending from the other end of said connection section opposite and parallel to said horizontal base section.

* * * * *